United States Patent [19]
Lemley

[11] Patent Number: 6,029,054
[45] Date of Patent: Feb. 22, 2000

[54] MMIC RECEIVER

[75] Inventor: Leo W. Lemley, Potomac, Md.

[73] Assignee: The United States of America as represented by the Secretary of the Navy, Washington, D.C.

[21] Appl. No.: 08/668,489

[22] Filed: May 31, 1996

Related U.S. Application Data

[60] Provisional application No. 60/009,402, Dec. 14, 1995.

[51] Int. Cl.$^7$ ...................................................... H04B 1/06
[52] U.S. Cl. ...................... 455/257; 455/189.1; 455/258; 455/255; 455/315; 455/332
[58] Field of Search ................................ 455/257, 189.1, 455/190.1, 191.1, 255, 251.1, 258, 259, 313, 315, 316, 318, 323, 332, 333, 260, 265; 330/295

[56] References Cited

U.S. PATENT DOCUMENTS

| | | | |
|---|---|---|---|
| 4,619,000 | 10/1986 | Ma | 455/191.1 |
| 4,726,072 | 2/1988 | Yamashita et al. | 455/315 |
| 5,014,349 | 5/1991 | Kubo et al. | 455/189.1 |
| 5,548,839 | 8/1996 | Caldwell et al. | 455/313 |
| 5,640,698 | 6/1997 | Shen et al. | 455/323 |

OTHER PUBLICATIONS

Brochure, "NRL Develops 0.5–18GHz MMIC Superhet Receiver," distributed at Electonics Warfare Symposium, Oct. 10–14, 1994.

Copy of brochure, NRL Develops 0.5–18GHz MMIC Superhet Receiver, interleaved page by page comparison of 1994 and 1995 versions of document AA of Applicant's first Information Disclosure Statement.

Quiles et al, "A Miniature 17/12 GHz MMIC Receicer for Satellite Communications", IEEE MTT–S Digest, pp. 961–964, Apr. 1995.

*Primary Examiner*—Vu Le
*Attorney, Agent, or Firm*—Barry A. Edelberg; Edward F. Miles

[57] ABSTRACT

A receiver, especially useful for MMIC semiconductor communications circuits, in which plural mixers replace LRC filter networks to produce notched bandwidth filters. In a preferred embodiment, the input signal and a the output of a variable oscillator are mixed to produce a beat frequency. As an operator changes the desired frequency notch of the receiver, the output frequency of variable oscillator similarly changes to ensure that the beat frequency is the same regardless of desired frequency. Circuity downstream may be thus fixed, eliminating the need for large variable capacitors, which MMIC technology cannot fabricate in desirably small sizes.

10 Claims, 7 Drawing Sheets

MMIC RECEIVER

This application has the priority of Provisional Application 60/009,402, filed Dec. 14, 1995.

BACKGROUND

The birth of Monolithic Microwave Integrated Circuit (i.e. MMIC) technology constituted a great advance in microwave hardware and the communication tasks performed by such hardware. MMIC devices are analog electronic circuits formed (typically) in gallium arsenide monolithic chips, and capable of operating at conventional microwave frequencies and above. With this technology, one could implement microwave circuits ranging in size from a table top box all the way down to the size of a pack of playing cards, which had before been the size of multiple freestanding equipment racks. Not only did this save size, but it also saved weight. This is a matter of considerable importance to aircraft which use microwave equipment because even more than size, the weight which the aircraft must carry is the most important factor limiting its performance. So well received has MMIC technology been that industry has developed extensive suites of standard chips ranging in complexity to simple circuit elements all the way to sophisticated programmable microprocessors.

One of the most basic applications of microwave circuitry is the radio receiver, which not only permits communication with an aircraft's pilot, but also can perform a myriad of electronic warfare functions. For this, the conventional heterodyne receiver is well-suited, and MMIC chips are well-suited to the fabrication of such receivers, with one drawback. Although MMIC chips can readily implement high or low pass filters, and by combining the two can readily implement narrowband filters, it cannot implement narrow passband filters. A heterodyne radio typically receives a desired signal via a narrow band (i.e. tuned) filter, mixes the signal with a local oscillator, and then passes the mixed signal through a filter with a sharp and narrow passband in the vicinity of the local oscillator's frequency. This filter helps remove unwanted noise which may have been near enough in frequency to the desired signal to have passed through the narrow band input filter, but, as importantly, also filters undesired spurs and images of the desired signal which were created by nonlinearities in the mixing process, and by other electronic devices in the receiver. Current MMIC technology cannot implement such a sharp, narrow, passband filter. Without such filtering, one will at best be left with a noisy signal, and at worst a signal buried in noise. Worse still, if one has an application requiring several mixers, the noise introduced at each stage is cumulative.

OBJECTS OF THE INVENTION

Accordingly, an object of the invention is to implement an effective microwave receiver entirely with MMIC technology.

Another object is to increase the signal to noise ratio in such a receiver.

Another object is to do the foregoing without the use of broadband filters, or other circuitry which cannot be readily implemented in MMIC technology.

In accordance with these and other objects made apparent hereinafter, the invention can be understood from the following detailed description of particular embodiments of the invention. It is understood, however, that the invention is capable of extended application beyond the precise details of these embodiments. Changes and modifications can be made to the embodiments that do not affect the spirit of the invention, nor exceed its scope, as will be recognized by those skilled in the art. The embodiments are described with particular reference to the accompanying drawings, wherein:

DETAILED DESCRIPTION

Figure 1:
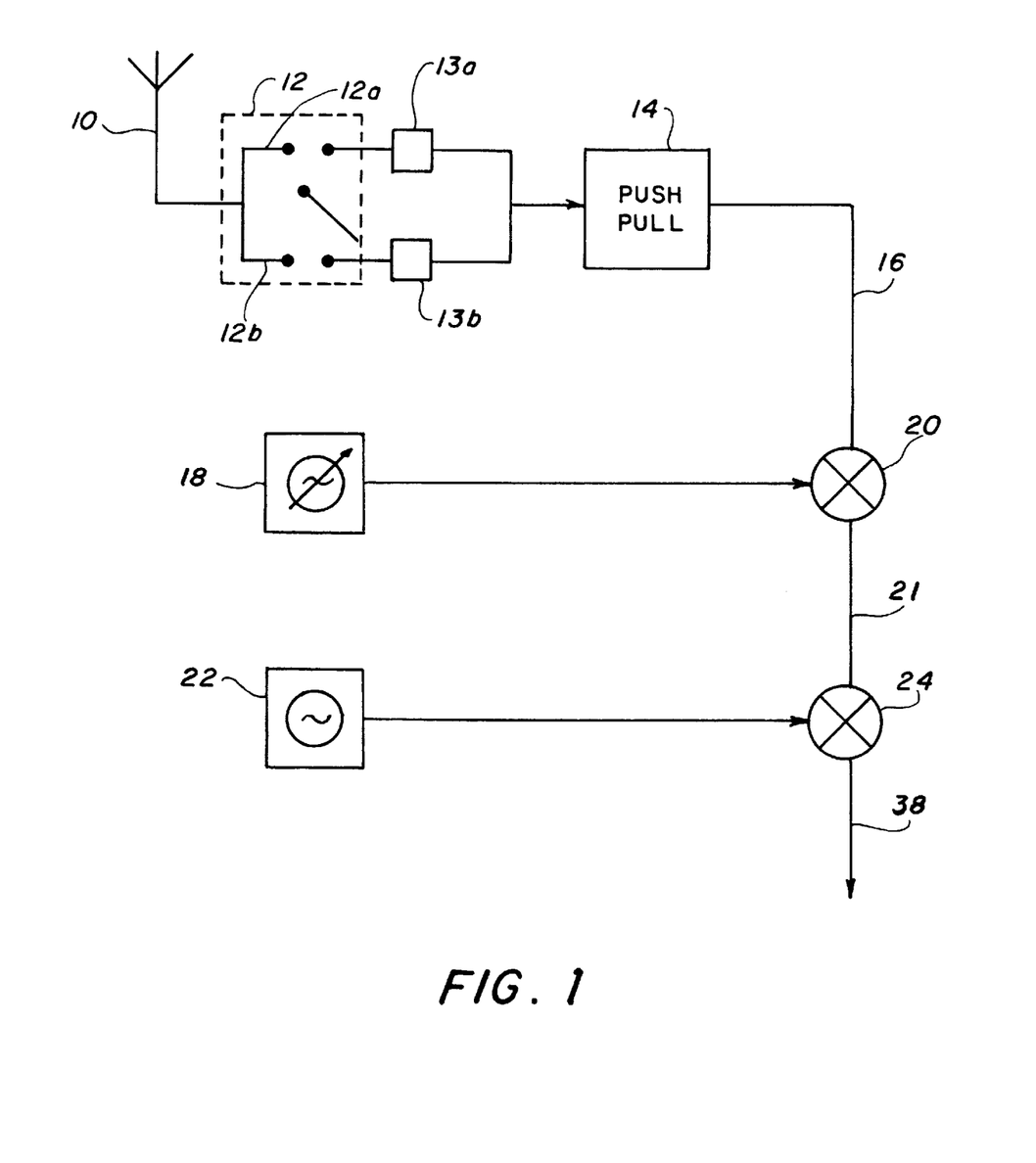
FIG. 1 is a plan circuit diagram illustrating an embodiment of the invention.

With reference to the drawing figures, wherein like numbers indicate like parts throughout the several views, FIG. 1 shows a circuit which receives a signal from an antenna 10 (e.g. a broadband microwave antenna). The signal is fed to a MMIC switch 12, which permits selective forwarding of the signal to subcircuits (generally indicated by subscripts a and b) via poles $12_a$, $12_b$. Passband filters $13_a$, $13_b$ permit forwarding of selected portions of the circuit's bandwidth to the two subcircuits, and the bands of filters $13_a$, $13_b$ are preferably contiguous in frequency, and span the bandwidth of interest. Together, switch 12 and filters 13 create two frequency channels for the circuit of FIG. 1, the output of each being directed to preselection filter 14. Filter 14 is preferably a balanced push-pull amplifier with input and output phase shifts of 180° between amplifier legs. As known to those skilled in the art, such an amplifier configuration, besides providing gain, causes harmonics generated of the input signal to self-cancel, thus maintaining the fundamental relatively noise free. Output 16 of preselector 14 goes to a balanced interference rejection mixer 20, where output 16 is mixed with tunable local oscillator 18. As also known to those skilled in the art, such a mixer causes cancellation of harmonics of signal 16. Output 21 of mixer stage 20 is preferably directed to an intermediate interference rejection mixer 24, where signal 21 is mixed with a fixed tone 22 of preselected frequency. Besides beating down signal 21 to a more convenient intermediate frequency, mixer 24 spreads out the spectrum of residual noise in signal 21, making it filterable by elements which one can fabricate using MMIC technology.

In operation, one decides a priori which frequency one would like the circuit to detect (hereafter, the "desired signal"). Antenna 10 outputs its broadband signal to switch 12. Switch 12 is set to the position which connects the output of antenna 10 to the bandpass filter $13_a$ or $13_b$ which comprehends the portion of antenna 10's signal having the frequency of interest. The frequency of local oscillator 18 is set so that the resultant beat 21 will be the same frequency, regardless of the input from filter 13. For example, if one wishes the beat signal 16 to be 3.35 GHz, and the desired signal is at 9 GHz, one would have to set variable oscillator 18's output to 5.65 GHz. If the desired signal is 12 GHz, one would have to set oscillator's output to 8.65 GHz, etc. Spurs and images created by mixers 20 tend to be even harmonics of the desired signal, and self-cancel as mentioned above. By selecting the frequency of local oscillator 18 to be that which will result in one preselected output frequency at 21 (3.35 GHz in the above examples), all the circuitry following 24, i.e. the circuitry which outputs at a constant intermediate frequency at 38, can be fixed, regardless of what the frequency of interest may be.

Figure 2:
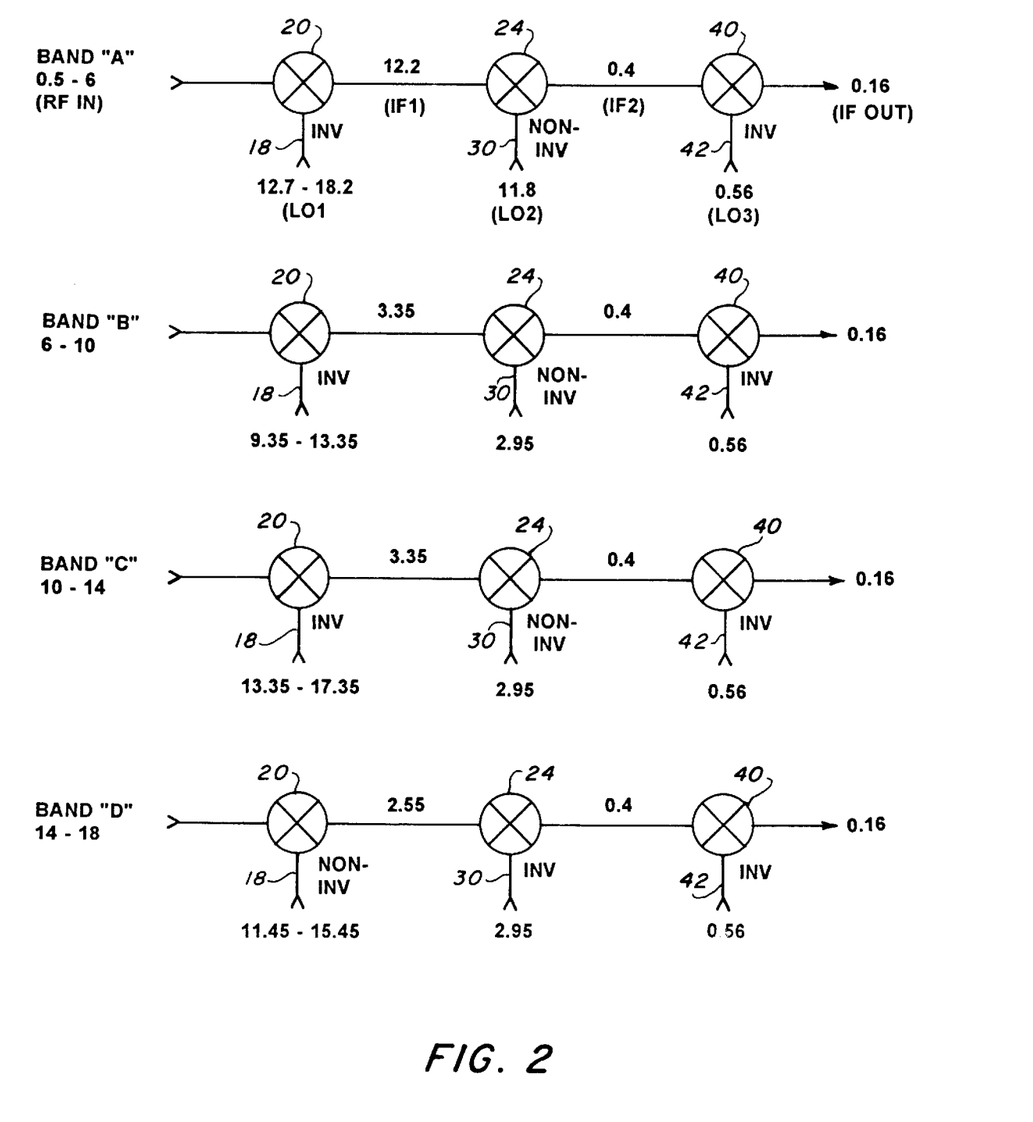
FIG. 2 is a schematic diagram illustrating an exemplary band plan for a circuit of according to the invention.

FIG. 2 shows an exemplary band plan for such a receiver, having a lowband from 0.5 to 6.0 GHz (band A), and a highband from 6.0 to 18 GHz. The highband is further subdivided into three subbands, band B (6–10 GHz), band C (10.0–14.0 GHz) and D (14.0–18.0 GHz). In bands B through D, the fixed intermediate frequency is 3.35 GHz, and the corresponding ranges of variable local oscillator 20 are 9.35 to 13.35 GHz, 13.35 to 17.35 GHz, and 11.45 to 15.45 GHz, respectively. The frequency of fixed local oscillator is 2.95 GHz, to produce an output beat frequency of 0.4 GHz (400 MHz). An additional mixer stage is added with an input of 0.56 GHz to produce a further output of 0.16 GHz. This is for convenience, as various equipment used by the military requires either a 400 MHz or 160 MHz input. Band A uses a different intermediate frequency of 12.2 GHz, and requires a variable local oscillator range of 12.7 to 18.2 GHz. Lowband A also provided fixed frequency output at 400 and 160 MHZ.

Figure 3A:
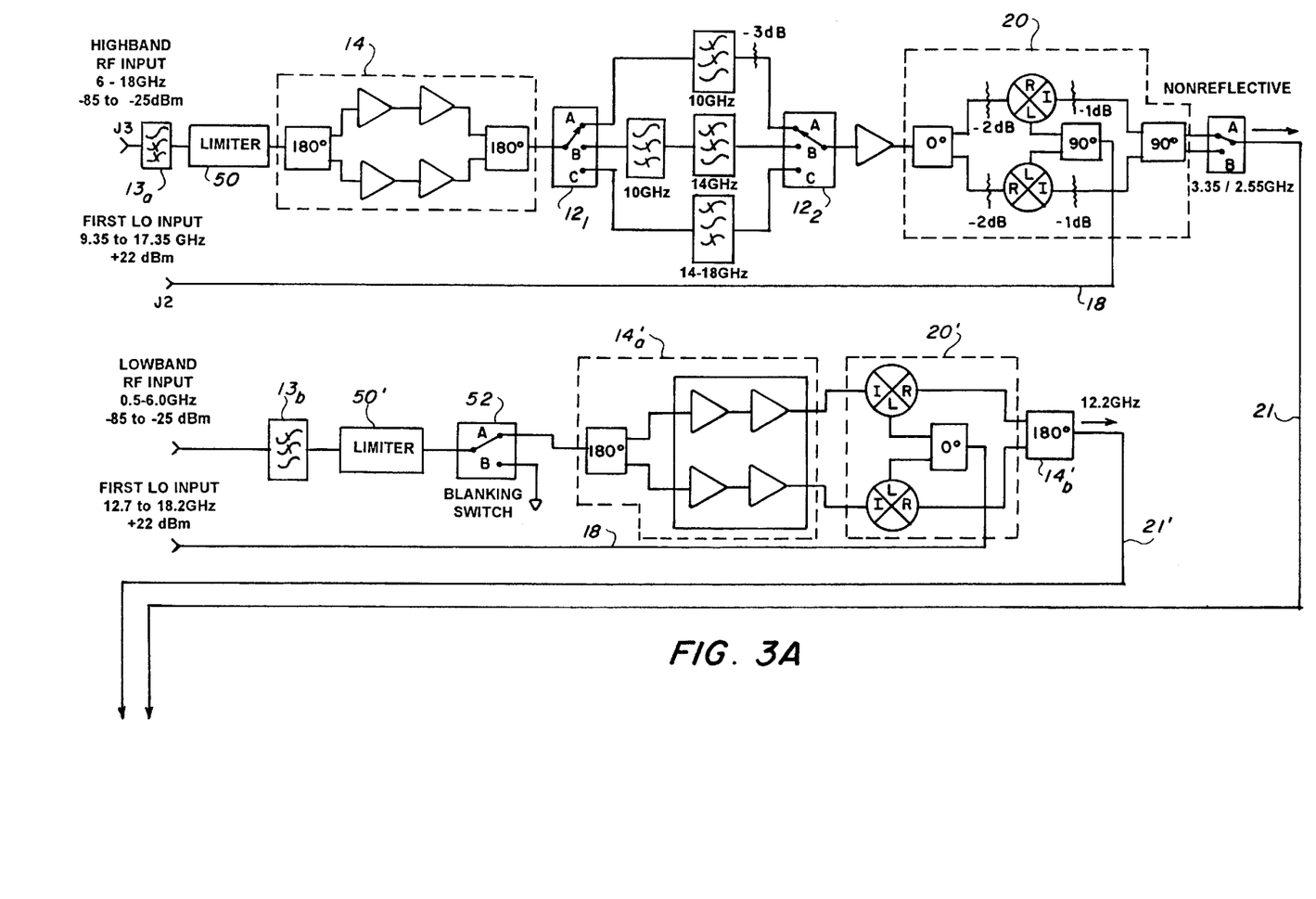
FIG. 3 is a schematic circuit diagram illustrating an embodiment of the invention using the bandplan of FIG. 2.
Figure 3B:
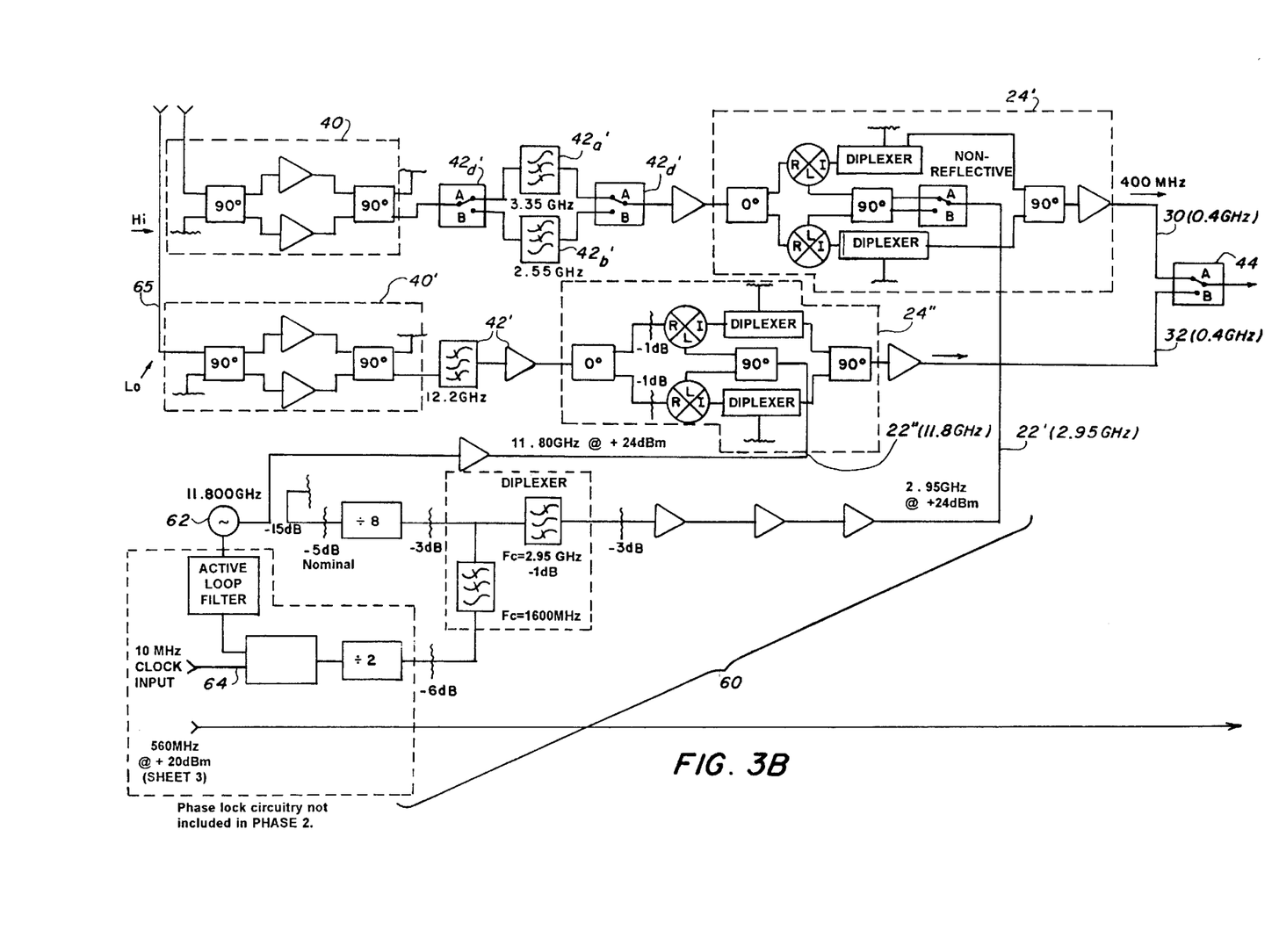
Figure 3C:
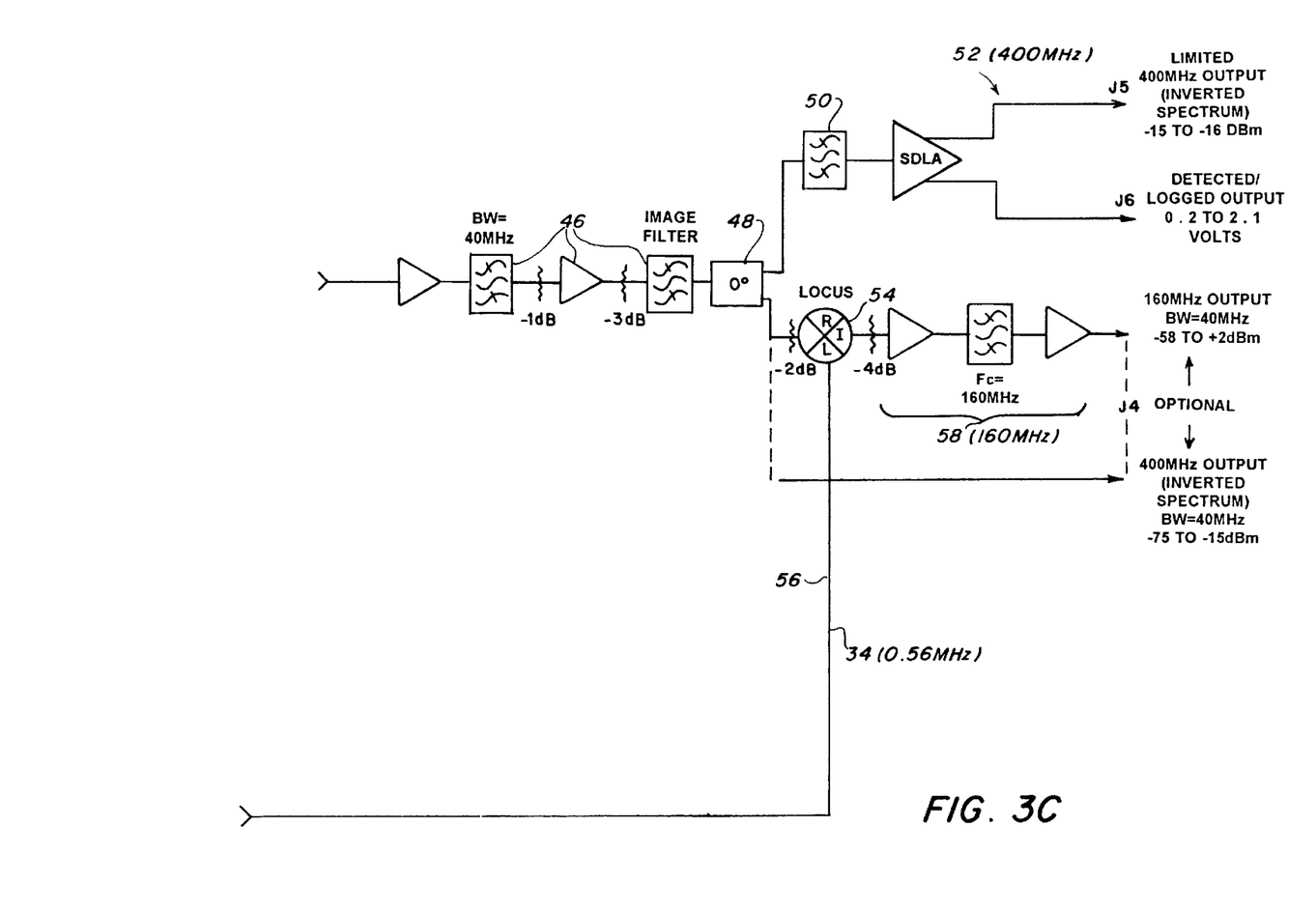

FIG. 3 shows a circuit according to the invention, having a band plan like that of FIG. 2. The input signal goes via a MMIC switch (not shown in FIG. 3) to either one of two MMIC filters 13a or 13$_b$', corresponding respectively to the highband and lowband of FIG. 2. Filter 13$_b$ is marked in FIG. 2 with three horizontal sinusoids, the top two of which have a cross mark, the bottom one of which does not. This indicates that 13$_b$ is a lowpass filter. (With this nomenclature, if the top sinusoid is uncrossed, it is high pass; if the middle sinusoid is uncrossed, the filter is bandpass.) Filter 13$_b$ operates to pass the lowband A. The lowband input goes to limiter 50, which shields the circuit from amplitude excursions, and switch 52 which permits optional disconnection of the lowband circuitry. Preselector 14$_a$, 14$_b$ is a balanced push-pull microwave amplifier having 180° phase shifts between legs at the input and output (the latter 14$_b$', which arbitrarily is placed after mixer 20'). The output of balanced amplifier 14' is mixed in balanced interference rejection mixer 20', where the signal is mixed with variable local oscillator 18. Oscillator 18 is tuned to ensure that the beat frequency output by mixers 20 is a constant 12.2 Ghz.

Output 21' of the lowband circuit goes to quadrature coupler 40', which serves to match mixer stages 20, 24. After filtering and signal amplification (42'), signal 21' is mixed with fixed intermediate frequency 22" (11.8 GHz) at balanced inference rejection mixers 24". The resultant output 30 (0.4 GHz, or 400 MHz) goes via switch 44 and filtering and gain stages 46 to inphase signal splitter 48. One portion of the output of 46 is further filtered (50), and made available via output 52 as an intermediate heterodyne frequency of 400 MHz for processing by other circuits. The other portion of the signal from splitter 48 goes to mixer 54, where the signal is mixed with a 0.56 GHz fixed frequency signal 56, to produce a beat frequency output of 0.16 GHz (160 MHz), similarly available for processing by other circuits.

The highband circuit is much the same as that for the lowband, having a highpass input 13$_a$ from antenna 10, limiter 50, push-pull preselection filter 14, and balanced interference rejection mixer 20 for mixing the highband input with variable oscillator 18. Additionally, the highband circuit has an MMIC filter bank 13$_a$', and switches 12$_1$, 12$_2$ for selectably switching among the three filters in bank 13$_a$'. The filters in bank 13$_a$' are a lowpass filter (marked "10 GHz"), a highpass filter (marked "14–18 GHz") and high- and lowpass filters in series marked "10 GHz" and "14 GHz", which together form a bandpass filter between 10 and 14 GHz. Collectively, switch 12$_a$ and filters in bank 13$_a$' subdivide the highband into sub-bands B, C, and D of FIG. 2, and permit one to selectably access any of the three sub-bands. The frequency of variable local oscillator is selected to cause the output 21 of mixers 20 to be a constant 3.35 GHz (or, for sub-band D, 2.25 GHz).

Output 21 of highband mixer 20 is processed much as is output 21' of lowband mixer 20', fed via matching circuit 40 to mixers 24' and via switches 42$_c$', 42$_d$' and filters 42$_a$', 42$_b$', which selectively permit passing the 3.35 GHz intermediate frequency for sub-bands B and C, or the 2.55 GHz of sub-band D. Balanced interference rejection mixers 24' beat the signal with fixed frequency signal 22' (2.95 GHz) to produce an output signal 30 at 0.4 GHz for all three sub-bands. Thereafter, switch 44 connects the 0.4 GHz signal to circuit elements 44, 46, etc., where the signal is processed as before to provide outputs at 400 and 160 MHz.

Continuing in FIG. 3, the intermediate frequencies 22' and 22" are provided by conventional phase locked active filter loop 60. Fixed oscillator 62 provides a signal at 11.8 GHz directly at 22", and by frequency division to 22', along with appropriate gain and filtering. An active loop ensures frequency and phase stablilty, and clock input 64 permits one to externally set the reference phase of loop 60.

Figure 4A:
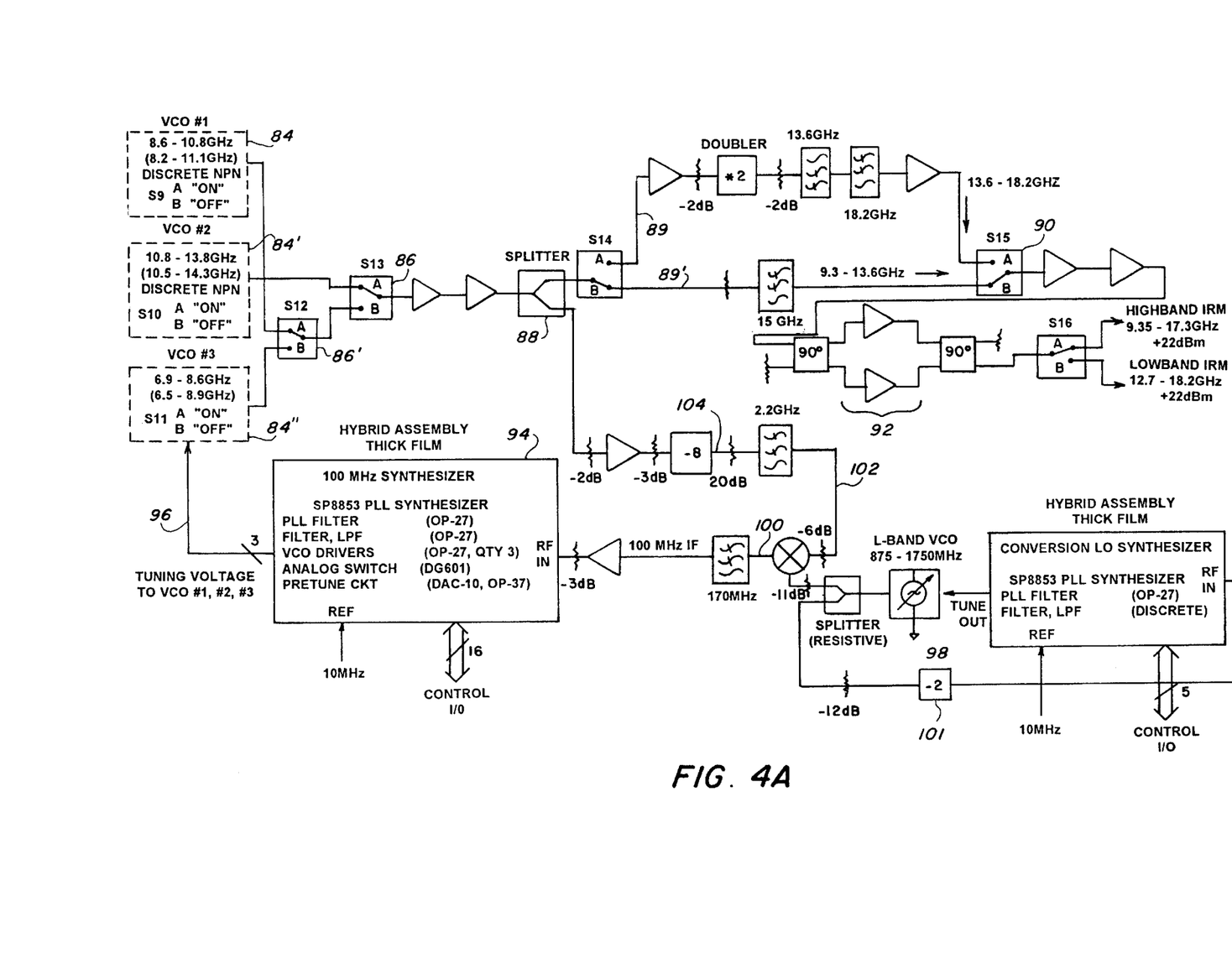
FIG. 4 is a schematic circuit diagram illustrating an oscillator for use with the circuit of FIG. 3.
Figure 4B:
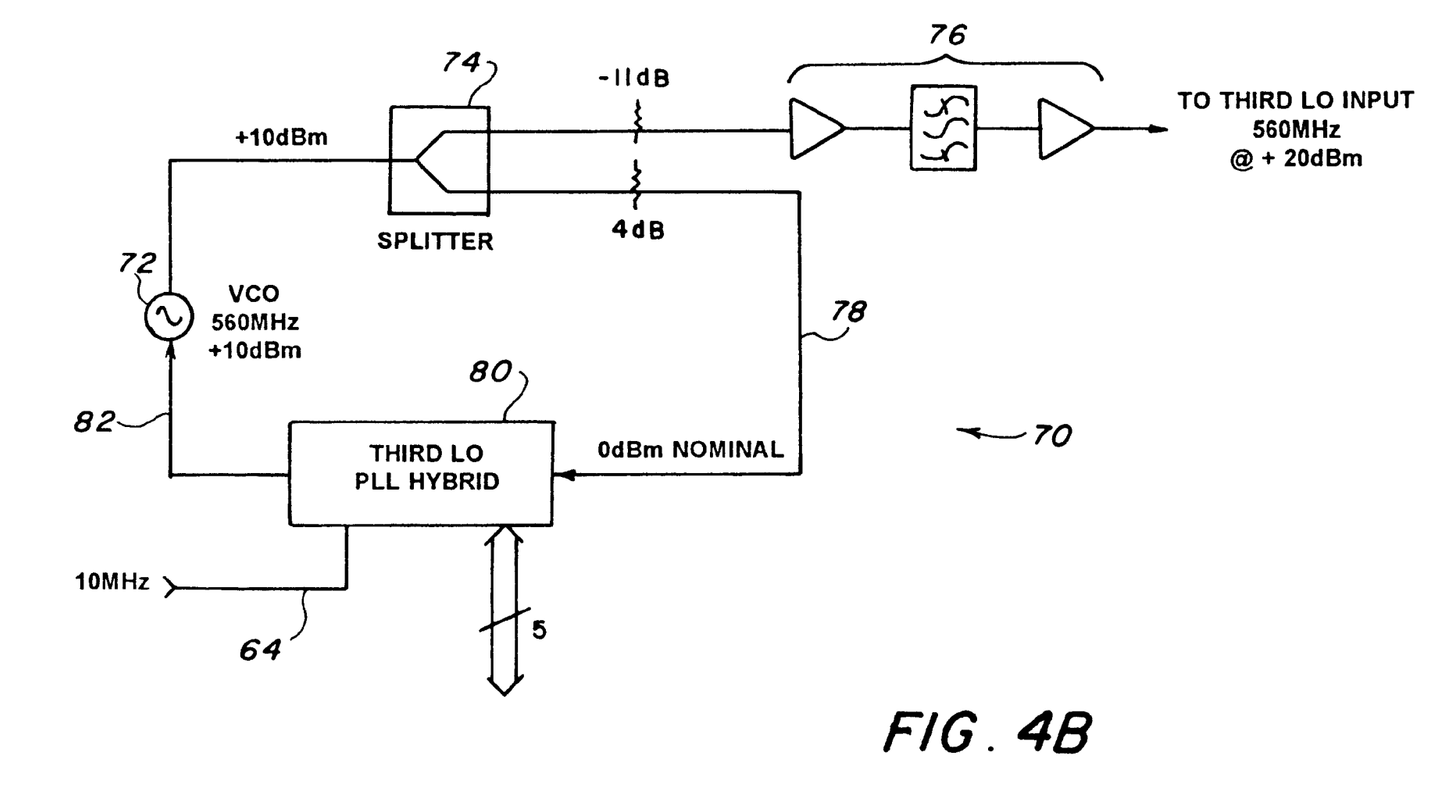

FIG. 4 shows circuitry for producing the fixed frequency signals discussed above. Circuit 70 produces an output of 560 Mhz using a voltage controlled oscillator 72 at that frequency, followed by a inphase splitter 74, one leg 76 of which goes to the circuit of FIG. 3, the other leg 78 of which goes to phase comparator 80, in response to which comparator 80 outputs a correction signal 82 to oscillator 72. The oscillators for the sub-bands of the highband are provided by respective voltage controlled oscillators 84, 84', 84", whose outputs are coupled through switches 86, 86' to permit selection of a desired one of oscillators 84. Similar to circuit 70, the output of these oscillators are split at splitter, a portion of which is directed to legs 89, 89', which contain filter to further subdivide the bandwidth of signal from splitter 88 into appropriate sub-bands, and the desired sub-band forwarded via switch 90 and matching stage 92 to the circuit of FIG. 3. The other portion of the signal split at 88 ultimately goes to phase comparator, in response to which outputs a correction signal 96 to voltage controlled oscillators 84. Local voltage controlled oscillator 98 and phase comparator (with splitter 101) constitute a phase locked loop which outputs a coarse correction signal to comparator 94 via mixer 100. Mixer 100 beats this correction signal with a signal at 102, which is the servo-feedback portion of the signal from splitter 88, divided in frequency by member. As the output frequency from oscillators 84 drifts in time, phase locked loop 98, 100, 101 provides a coarse correction signal to phase comparator 94, and loop 102, 104 provides a fine correction signal to comparator 94, and thence ultimately to voltage controlled oscillators 84.

The foregoing discusses circuits with many switching and other active functions. These are preferably performed by a conventional MMIC microprocessor programmed to the desired tasks.

The invention has been described in what is considered to be the most practical and preferred embodiments. It is recognized, however, that obvious modifications to these embodiments may occur to those with skill in this art. Accordingly, the scope of the invention is to be discerned from reference to the appended claims, wherein:

I claim:

1. A circuit for detecting signals at a preselected plurality of desired frequencies, said circuit comprising:
   means for receiving an input signal into said circuit;
   a mixer;
   an oscillator, said oscillator having plural selectable output frequencies;
   means for selecting one of said plurality of desired frequencies;
   means for directing the output of said oscillator, and said input signal, to said mixer effective to cause the output of said mixer to be a signal having a resultant beat frequency;
   means, responsive to said selecting of said one of said plurality of frequencies, for causing said output frequency of said oscillator to be selected effective to cause said beat frequency to be substantially the same for all of said desired frequencies.

2. The circuit of claim 1, wherein said circuit further comprises:
   at least two bandpass filters disposed in parallel;
   switch means for selectably connecting one of said at least two bandpass filters to the remainder of said circuit effective to filter said input signal.

3. The circuit of claim 2, further comprising a push-pull amplifier operatively disposed upstream of said mixer.

4. The circuit of claim 3, wherein said circuit further comprises:
   an oscillator adapted to produce an output at a fixed tone; and
   an additional mixer disposed to mix said output at said fixed tone with said signal at said beat frequency.

5. The circuit of claim 1, wherein said circuit further comprises:
   an oscillator adapted to produce an output at a fixed tone; and
   an additional mixer disposed to mix said output at said fixed tone with said signal at said beat frequency.

6. A method for detecting signals at a preselected plurality of desired frequencies, said method comprising:
   receiving an input signal;
   selecting one of said plurality of desired frequencies;
   mixing said input signal and a second signal, effective to cause said mixer to output a signal at a resultant beat frequency;
   selecting, responsive to said selecting said one of said plurality of desired frequencies, said second signal to be of a frequency effective to cause said beat frequency to be substantially the same for all said plurality of desired frequencies.

7. The method of claim 6, wherein said method further comprises:
   disposing at least two bandpass filters disposed in parallel;
   employing switch means for selectably connecting one of said at least two bandpass filters to selectably filter said input signal.

8. The method of claim 7, further comprising disposing a push-pull amplifier operatively disposed upstream of said mixer.

9. The method of claim 8, wherein said method further comprises mixing a fixed tone with said output at said beat frequency.

10. A circuit for detecting a preselected plurality of frequencies, comprising:
   a receiver for receiving a signal into said circuit; and
   an oscillator adapted to permit said oscillator to selectably output a signal at a plurality of oscillator frequencies;
   wherein said circuit is adapted to have a preselected beat frequency; and
   wherein said plurality of oscillator frequencies are selected such that the beat frequency of each of said preselected plurality of frequencies with at least one of said plurality of oscillation frequencies is substantially the same as said preselected beat frequency.

* * * * *